US012704538B2

(12) United States Patent
Yi et al.

(10) Patent No.: US 12,704,538 B2
(45) Date of Patent: Aug. 11, 2026

(54) GIS PARTIAL DISCHARGE DIAGNOSING METHOD, MODEL TRAINING METHOD, DEVICE AND SYSTEM

(71) Applicant: ZHUHAI ELECTAC HIGH TECHNOLOGY CO., LTD., Zhuhai (CN)

(72) Inventors: Xiaobo Yi, Zhuhai (CN); Kai Yang, Zhuhai (CN); Jianming Wu, Zhuhai (CN); Hua Zhang, Zhuhai (CN); Chusheng Miao, Zhuhai (CN); Maowen Han, Zhuhai (CN); Hairong Lin, Zhuhai (CN); Haojian Huang, Zhuhai (CN); Laijin Fang, Zhuhai (CN)

(73) Assignee: ZHUHAI ELECTAC HIGH TECHNOLOGY CO., LTD., Zhuhai (CN)

( * ) Notice: Subject to any disclaimer, the term of this patent is extended or adjusted under 35 U.S.C. 154(b) by 381 days.

(21) Appl. No.: 18/556,436

(22) PCT Filed: Aug. 30, 2023

(86) PCT No.: PCT/CN2023/115797

§ 371 (c)(1),
(2) Date: Oct. 20, 2023

(87) PCT Pub. No.: WO2024/046363

PCT Pub. Date: Mar. 7, 2024

(65) Prior Publication Data

US 2024/0345153 A1 Oct. 17, 2024

(30) Foreign Application Priority Data

Sep. 1, 2022 (CN) ......................... 202211062539.0

(51) Int. Cl.
*G01R 31/12* (2020.01)

(52) U.S. Cl.
CPC ................................ *G01R 31/1254* (2013.01)

(58) Field of Classification Search
CPC ................................................ G01R 31/1254
See application file for complete search history.

(56) References Cited

U.S. PATENT DOCUMENTS 6,313,640 B1 11/2001 Nasrallah et al.
6,418,385 B1 7/2002 Hucker et al.
(Continued)

FOREIGN PATENT DOCUMENTS

CN 102645621 A 8/2012
CN 105676085 A 6/2016
(Continued)

OTHER PUBLICATIONS

The-Duong Do, Convolutional-Neural-Network-Based Partial Discharge Diagnosis for Power Transformer Using UHF Sensor; accepted Nov. 10, 2020, date of publication Nov. 17, 2020, date of current version Nov. 27, 2020. IEEE Access.
(Continued)

*Primary Examiner* — Daryl C Pope
(74) *Attorney, Agent, or Firm* — Epstein Drangel LLP; Robert L. Epstein

(57) ABSTRACT

A GIS partial discharge diagnosing method, a model training method, a device and a system are disclosed. Sensor modules are in communication with each other, so that sensor network position distribution data of each sensor module in a wireless transmission network can be determined. In a training process of a partial discharge diagnosing model, a spatial-temporal feature of the partial discharge is introduced, so that the trained partial discharge diagnosing model is adaptive to different GIS equipment and different sensors layout solutions, and has better model universality and applicability, thus greatly saving a training time of the model
(Continued)

and expediting the deployment of the partial discharge diagnosing model. Moreover, the model trained in the present disclosure accounts for the relationship between the position where partial discharge occurs and the sensor network position distribution.

10 Claims, 6 Drawing Sheets

(56) References Cited

U.S. PATENT DOCUMENTS

| | | | | |
|---|---|---|---|---|
| 2006/0132144 | A1* | 6/2006 | Kato | G01R 31/085 324/536 |
| 2013/0179100 | A1* | 7/2013 | Guo | G01R 31/1227 702/58 |
| 2013/0211750 | A1 | 8/2013 | Garnacho et al. | |
| 2020/0271714 | A1 | 8/2020 | Barrios Pereira et al. | |

FOREIGN PATENT DOCUMENTS

| | | | |
|---|---|---|---|
| CN | 106353651 | A | 1/2017 |
| CN | 107505549 | A | 12/2017 |
| CN | 107831422 | A | 3/2018 |
| CN | 109116203 | A | 1/2019 |
| CN | 109116204 | A | 1/2019 |
| CN | 110579693 | A | 12/2019 |
| CN | 111007365 | A | 4/2020 |
| CN | 111638046 | A | 9/2020 |
| CN | 111638431 | A | 9/2020 |
| CN | 111856224 | A | 10/2020 |
| CN | 112034310 | A | 12/2020 |
| CN | 112630585 | A | 4/2021 |
| CN | 114355114 | | 4/2022 |
| GB | 2431726 | A | 5/2007 |
| KR | 20100044425 | A | 4/2010 |
| KR | 20200131492 | A | 11/2020 |

OTHER PUBLICATIONS

J. Fuhr, M. Haessig, Detection and Location of Internal Defects in the Insulation of Power Transforrners, IEEE Transactions on Electrical Insulation, vol. 28 No. 6, Dec. 1993.

Ma Zhiguang, Identification and Diagnosis of GIS Partial Discharge Defects Based on UHF Live Detection Technology, Journal of State Grid Technology College, vol. 19 No. 1.

Zhang Xinbo, Pattern Recognition Based on Deep Neural Network for Partial Discharge, China Academic Journal Electronic Publishing House May 2017.

Yang Gang, Study on Ultrasonic Signal Characteristics and Pattern Recognition Method of Typical Defect Partial Discharge, China Academic Journal Electronic Publishing House May 2020.

International Search Report for PCT/CN2023/115797, Date of the actual completion of the international search Oct. 28, 2023.

Written Opinion of International Search Report for PCT/CN2023/115797, Date of the actual completion of the written opinion Oct. 28, 2023.

First Search Report for CN2022110625390, dated Mar. 15, 2023.

* cited by examiner

Obtaining, by the monitoring host, monitoring data of each sensor module, the monitoring data comprising partial discharge ultra high frequency signals monitored by each sensor module, receiving time information of the partial discharge ultra high frequency signals monitored by each sensor module and sensor network position distribution data of the wireless transmission network

801

Inputting, by the monitoring host, the monitoring data into a partial discharge diagnosing model for prediction processing, and determining a predicted partial discharge type

802

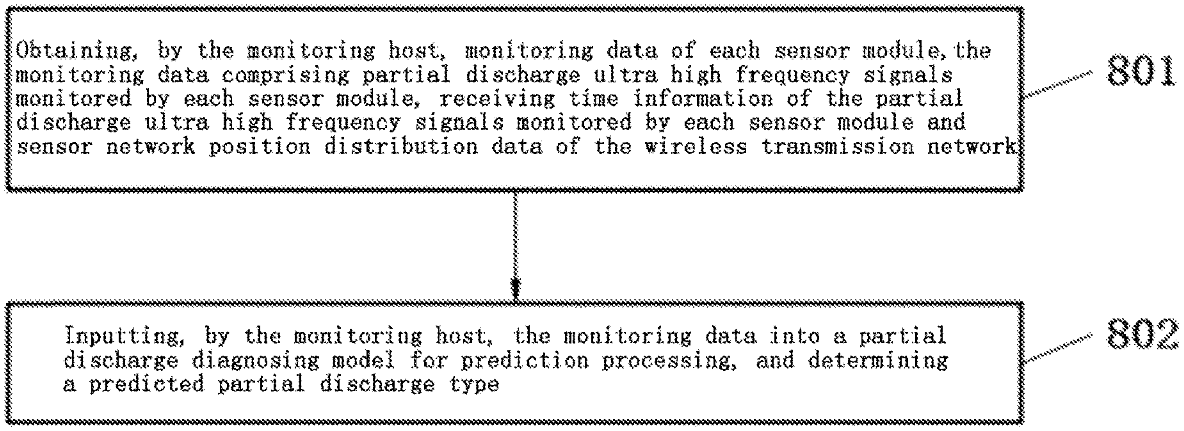

FIG. 8

GIS PARTIAL DISCHARGE DIAGNOSING METHOD, MODEL TRAINING METHOD, DEVICE AND SYSTEM

CROSS-REFERENCE TO RELATED APPLICATIONS

This application is a national stage filing under 35 U.S.C. § 371 of international application number PCT/CN2023/115797, filed Aug. 30, 2023, which claims priority to Chinese patent application No. 202211062539.0 filed Sep. 1, 2022. The contents of these applications are incorporated herein by reference in their entirety.

TECHNICAL FIELD

The present disclosure relates to the technical field of a partial discharge diagnosing method, and in particular to a GIS partial discharge diagnosing method, a model training method, a device and a system.

BACKGROUND

Gas Insulated Switchgear (GIS) is a combined type of switchgear which encloses various equipment such as a circuit breaker, an isolating switch, a grounding switch and a busbar, etc. in a metal shell filled with sulfur hexafluoride gas. The gas insulated switchgear is key equipment in high-voltage power transmission and transformation projects. Any fault in GIS can potentially lead to significant power grid accidents. Partial discharge (PD) in some weak parts of GIS under the action of a strong electric field is a common problem in high-voltage insulation, and the partial discharge is an effective means to diagnose insulation defects of substation equipment. Through the partial discharge detection on the GIS, the internal insulation status of the GIS may be effectively grasped, and the power grid accident caused by GIS insulation fault tripping may be prevented.

At present, an ultrasonic detecting method and an ultra high frequency (UHF) method are mainly used for detecting the partial discharge in the GIS. The ultrasonic detecting method detects a partial discharge signal by detecting ultrasonic and vibration signals generated by the partial discharge with an ultrasonic probe, and measures a level of the partial discharge in the GIS. The ultra high frequency method detects the partial discharge signal by receiving an UHF electromagnetic wave signal in a range of 300-3000 MHz generated by the PD through an antenna, and then measures the partial discharge level in the GIS.

Traditional partial discharge detection is performed by a worker using a portable partial discharge detector, which is limited by the experience of the worker, leading to inaccuracy in the detection of a partial discharge type. An alternative involves the installation of sensors on the GIS for online partial discharge detection. Electrical signals detected by the sensors through antenna coupling are converted into discharge spectrum, and the worker may analyze the discharge spectrum to determine partial discharge types and approximate areas where the partial discharge occurs in the GIS. Because different partial discharge types have corresponding classical spectrum thereof, the worker may determine the partial discharge type by comparing with different types of discharge spectrum. Due to variations in GIS models, on-site conditions, and sensor placements, the partial discharge spectrum detected in the site may not necessarily match with the classical discharge spectrum in an ideal state, leading to inaccurate or unidentified detection. Moreover, the discharge phenomenon does not necessarily occur inside the GIS, and other external discharge signals, such as the interference from other external power equipment or lightning, may also result in a discharge phenomenon (the interfered discharge spectrum may also be similar to the classic spectrum), therefore false detection may be caused.

SUMMARY

In order to solve at least one of the above technical problems, the present disclosure provides a GIS partial discharge diagnosing method, a model training method, a device, a system and a computer readable storage medium, which can improve the accuracy of the GIS partial discharge detection and the universality of a partial discharge diagnosing model.

According to a first aspect of the present disclosure, a GIS partial discharge diagnosing method is provided and applied to a GIS partial discharge diagnosing device, wherein the GIS partial discharge diagnosing device comprises a monitoring host, a network relay device and a plurality of sensor modules distributed on a GIS, and the sensor modules are used for monitoring ultra high frequency signals generated when GIS partial discharge occurs; each of the sensor modules comprises a wireless transmission device and is in communication with the network relay device, and the sensor modules are connected with each other through an ad-hoc network of the wireless transmission devices to form a wireless transmission network, each of the sensor modules obtains a distance from other sensor modules through a wireless communication time, so as to obtain sensor network position distribution data of each of the sensor modules in the wireless transmission network, and the network position distribution data are sent to the network relay device, and the monitoring host is in communication with the network relay device;

the diagnosing method comprises:

obtaining, by the monitoring host, monitoring data of each sensor module, the monitoring data comprising partial discharge ultra high frequency signals monitored by each sensor module, receiving time information of the partial discharge ultra high frequency signals monitored by each sensor module and sensor network position distribution data of the wireless transmission network;

inputting, by the monitoring host, the monitoring data into a partial discharge diagnosing model for prediction processing, and determining a predicted partial discharge type;

wherein, the partial discharge diagnosing model is obtained by the following training method:

obtaining, by the monitoring host, the partial discharge diagnosing model from a training server;

obtaining, by the monitoring host, training data, the training data comprising training feature data and labeling information; the training feature data comprising the partial discharge ultra high frequency signals monitored by each sensor module, the receiving time information of the partial discharge ultra high frequency signals monitored by each sensor module and the sensor network position distribution data of the wireless transmission network; the labeling information comprising a partial discharge type;

inputting, by the monitoring host, the training feature data into the partial discharge diagnosing model for prediction processing, and determining a predicted partial discharge type; and correcting, by the monitoring host, the partial discharge diagnosing model according to the predicted partial discharge type.

In some embodiments of the present disclosure, the training data further comprises a signal attenuation feature, the signal attenuation feature comprises signal amplitude differences between the ultra high frequency signals detected by each sensor module or differences between various measurement items in a discharge spectrum of each sensor module.

In some embodiments of the present disclosure, the obtaining, by the monitoring host, training data, comprises at least one of:

obtaining the training data from the training server, wherein the training data is data previously collected in other GIS partial discharge detecting devices;

or, obtaining the training data from a memory of the monitoring host, wherein the training data is data previously collected by the current GIS partial discharge diagnosing device;

or, collecting the partial discharge ultrahigh frequency signals which are detected by each sensor module and generated by a partial discharge generating device arranged on the GIS, and recording a time when each sensor module receives the partial discharge ultra high frequency signals, the sensor network position distribution data perceived by each sensor module when communicating with each other, and the partial discharge type determined when the partial discharge generating device is arranged, to obtain the training data; and or, obtaining the training data through a partial discharge simulating model established by a computer, wherein the training data is simulated test data.

In some embodiments of the present disclosure, the inputting the training feature data into the partial discharge diagnosing model for prediction processing, and determining a predicted partial discharge type, comprises:

vectorizing the partial discharge ultra high frequency signals to obtain a partial discharge ultra high frequency signal feature;

vectorizing the receiving time information and the sensor network position distribution data respectively to obtain a receiving time feature and a sensor network position distribution feature;

inputting the receiving time feature and the sensor network position distribution feature into a fusion model for cross combination to obtain an interactive feature, and combining, by the fusion model, the receiving time feature, the sensor network position distribution feature and the interactive feature to obtain a combined attribute feature;

concatenating the combined attribute feature with the partial discharge ultra high frequency signal feature to obtain a partial discharge ultra high frequency signal fused feature; and inputting the partial discharge ultra high frequency signal fused feature into a partial discharge diagnosing model for prediction processing, and determining the predicted partial discharge type; and the correcting the partial discharge diagnosing model according to the predicted partial discharge type, comprises:

correcting the partial discharge diagnosing model and the fusion model according to the predicted partial discharge type.

In some embodiments of the present disclosure, the combining, by the fusion model, the receiving time feature, the sensor network position distribution feature and the interactive feature to obtain a combined attribute feature, comprises:

weighting and summing the receiving time feature, the sensor network position distribution feature and the interactive feature to obtain the combined attribute feature.

In some embodiments of the present disclosure, the combined attribute feature is expressed as:

$$S_P = W_0 + W_1 d_1 + W_2 d_2 + W_3 d_1 d_2;$$

wherein $S_P$ is the combined attribute feature, $W_0$, $W_1$, $W_2$ and $W_3$ are parameters of the fusion model, $d_1$ is a value of the receiving time feature, and $d_2$ is a value of the sensor network position distribution feature.

In some embodiments of the present disclosure, the sensor modules are arranged outside the GIS, and the GIS comprises a plurality of preset sensors arranged inside a GIS pipeline, the plurality of preset sensors are used for detecting the ultra high frequency signals generated when the GIS partial discharge occurs and outputting the ultra high frequency signals to the monitoring host, and the monitoring host forms a second discharge spectrum according to the ultra high frequency signals detected by each preset sensor; and the training feature data further comprises the second discharge spectrum.

In some embodiments of the present disclosure, the partial discharge type in the labeling information is obtained by:

when the GIS partial discharge occurs, obtaining, by the monitoring host or the training server, the partial discharge ultra high frequency signals monitored by each sensor module, and generating a monitored discharge spectrum according to the partial discharge ultra high frequency signals, and determining, by the monitoring host, a partial discharge occurrence type according to the monitored discharge spectrum and a classical discharge spectrum, and further determining the partial discharge type in the labeling information; and the training method further comprises:

comparing the predicted partial discharge type with the partial discharge type in the labeling information to determine a prediction accuracy rate of the partial discharge diagnosing model in a current training step; and when the prediction accuracy rate is greater than a preset value, generating a target discharge spectrum based on the partial discharge ultra high frequency signals in the training feature data, and updating the classical discharge spectrum according to the target discharge spectrum.

According to a second aspect of the present disclosure, a training method for a GIS partial discharge diagnosing model is provided and applied to a GIS partial discharge diagnosing device, wherein the GIS partial discharge diagnosing device comprises a monitoring host, a network relay device and a plurality of sensor modules distributed on a GIS, and the sensor modules are used for monitoring ultra high frequency signals generated when GIS partial discharge occurs; each of the sensor modules comprises a wireless transmission device and is in communication with the network relay device, and the sensor modules are connected with each other through an ad-hoc network of the wireless transmission devices to form a wireless transmission network, each of the sensor modules obtains a distance from other sensor modules through a wireless communication time, so as to obtain sensor network position distribution data of each of the sensor modules in the wireless transmission network, and the network position distribution data are sent to the network relay device, and the monitoring host is in communication with the network relay device; and the training method comprises:

obtaining, by the monitoring host, the partial discharge diagnosing model from a training server;

obtaining, by the monitoring host, training data, the training data comprising training feature data and labeling information; the training feature data comprising partial discharge ultra high frequency signals monitored by each sensor module, receiving time information of the partial discharge ultra high frequency signals monitored by each sensor module and sensor network position distribution data of the wireless transmission network; and the labeling information comprising a partial discharge type;

inputting, by the monitoring host, the training feature data into the partial discharge diagnosing model for prediction processing, and determining a predicted partial discharge type; and correcting, by the monitoring host, the partial discharge diagnosing model according to the predicted partial discharge type.

According to a third aspect of the present disclosure, a global training method for a GIS partial discharge diagnosing model is provided and applied to a global training system, wherein the global training system comprises a training server and a plurality of GIS partial discharge diagnosing devices on different transformer substation GISs, each of the GIS partial discharge diagnosing devices comprises a monitoring host, a network relay device and a plurality of sensor modules distributed on a GIS, and the sensor modules are used for monitoring ultra high frequency signals generated when GIS partial discharge occurs; each of the sensor modules comprises a wireless transmission device and is in communication with the network relay device, and the sensor modules are connected with each other through an ad-hoc network of the wireless transmission devices to form a wireless transmission network, each of the sensor modules obtains a distance from other sensor modules through a wireless communication time, so as to obtain sensor network position distribution data of each of the sensor modules in the wireless transmission network, and the network position distribution data are sent to the network relay device, and the monitoring host is in communication with the network relay device;

a global GIS partial discharge diagnosing model is arranged in the training server; and the training method comprises:

obtaining, by each monitoring host, the global GIS partial discharge diagnosing model from the training server, and generating a corresponding partial discharge diagnosing model according to the global GIS partial discharge diagnosing model;

training, by each monitoring host, according to the training method for a GIS partial discharge diagnosing model according to the second aspect, and obtaining network parameters of the trained partial discharge diagnosing model; and feeding back, by each monitoring host, the obtained network parameters to the training server, to enable the training server to update the global GIS partial discharge diagnosing model.

According to a fourth aspect of the present disclosure, a training device for a GIS partial discharge diagnosing model is provided. The GIS partial discharge diagnosing device comprises a monitoring host, a network relay device and a plurality of sensor modules distributed on a GIS, and the sensor modules are used for monitoring ultra high frequency signals generated when GIS partial discharge occurs; each of the sensor modules comprises a wireless transmission device and is in communication with the network relay device, and the sensor modules are connected with each other through an ad-hoc network of the wireless transmission devices to form a wireless transmission network, each of the sensor modules obtains a distance from other sensor modules through a wireless communication time, so as to obtain sensor network position distribution data of each of the sensor modules in the wireless transmission network, and the network position distribution data are sent to the network relay device, and the monitoring host is in communication with the network relay device:

wherein, the monitoring host obtains a partial discharge diagnosing model from a training server;

the monitoring host obtains training data, the training data comprises training feature data and labeling information: the training feature data comprises partial discharge ultra high frequency signals monitored by each sensor module, receiving time information of the partial discharge ultra high frequency signals monitored by each sensor module and sensor network position distribution data of the wireless transmission network; and the labeling information comprises a partial discharge type;

the monitoring host inputs the training feature data into the partial discharge diagnosing model for prediction processing, and determines a predicted partial discharge type; and the monitoring host corrects the partial discharge diagnosing model according to the predicted partial discharge type.

According to a fifth aspect of the present disclosure, a global system for a GIS partial discharge diagnosing model is provided, wherein the global training system comprises a training server and a plurality of GIS partial discharge diagnosing devices on different transformer substation GISs, each of the GIS partial discharge diagnosing devices comprises a monitoring host, a network relay device and a plurality of sensor modules distributed on a GIS, and the sensor modules are used for monitoring ultra high frequency signals generated when GIS partial discharge occurs; each of the sensor modules comprises a wireless transmission device and is in communication with the network relay device, and the sensor modules are connected with each other through an ad-hoc network of the wireless transmission devices to form a wireless transmission network, each of the sensor modules obtains a distance from other sensor modules through a wireless communication time, so as to obtain sensor network position distribution data of each of the sensor modules in the wireless transmission network, and the network position distribution data are sent to the network relay device, and the monitoring host is in communication with the network relay device;

a global GIS partial discharge diagnosing model is arranged in the training server;

each monitoring host obtains the global GIS partial discharge diagnosing model from the training server, and generates a corresponding partial discharge diagnosing model according to the global GIS partial discharge diagnosing model;

each monitoring host performs training according to the training device for a GIS partial discharge diagnosing model in the fourth aspect of the present disclosure, and obtains network parameters of the trained partial discharge diagnosing model; and each monitoring host feeds back the obtained network parameters to the training server to enable the training server to update the global GIS partial discharge diagnosing model.

According to a sixth aspect of the present disclosure, a GIS partial discharge diagnosing device is provided and comprises a monitoring host, a network relay device and a plurality of sensor modules distributed on a GIS, and the sensor modules are used for monitoring ultra high frequency signals generated when GIS partial discharge occurs; each of the sensor modules comprises a wireless transmission device and is in communication with the network relay device, and the sensor modules are connected with each other through an ad-hoc network of the wireless transmission devices to form a wireless transmission network, each of the sensor modules obtains a distance from other sensor modules through a wireless communication time, so as to obtain sensor network position distribution data of each of the sensor modules in the wireless transmission network, and the network position distribution data are sent to the network relay device, and the monitoring host is in communication with the network relay device;

the monitoring host obtains monitoring data of each sensor module, the monitoring data comprises partial discharge ultra high frequency signals monitored by each sensor module, receiving time information of the partial discharge ultra high frequency signals monitored by each sensor module and sensor network position distribution data of the wireless transmission network; and the monitoring host inputs the monitoring data into a partial discharge diagnosing model for prediction processing, and determines a predicted partial discharge type.

In another aspect, an embodiment of the present disclosure further provides an electronic device, comprising a memory and a processor, the memory stores a computer program which, when executed by the processor, causes to implement the training method for a GIS partial discharge diagnosing model, the global training method for a GIS partial discharge diagnosing model or the GIS partial discharge diagnosing method.

In another aspect, an embodiment of the present disclosure further provides a computer readable storage medium storing a program which, when executed by a processor, causes to implement the training method for a GIS partial discharge diagnosing model, the global training method for a GIS partial discharge diagnosing model or the GIS partial discharge diagnosing method.

In another aspect, a computer program product or a computer program is provided, wherein the computer program product or the computer program comprises a computer instruction, and the computer instruction is stored in a computer readable storage medium. A processor of a computer device reads the computer instruction from the computer readable storage medium, the processor performs the computer instruction to enable the computer device to perform and implement the training method for a GIS partial discharge diagnosing model, the global training method for a GIS partial discharge diagnosing model or the GIS partial discharge diagnosing method.

The embodiments of the present disclosure have the beneficial effects as follows.

Because the sensor modules in the GIS partial discharge diagnosing device are in communication with each other, the positions of the sensor modules relative to each other and to the network relay device can be determined according to the communication duration, so that the sensor network position distribution data of each sensor module in the wireless transmission network can be determined. Moreover, because the distance of the GIS partial discharge position from each sensor module is different, the time when each sensor module receives the partial discharge ultra high frequency signal is also different, which reflects the relationship between the actual partial discharge position and the sensor network position. In the training process of the partial discharge diagnosing model, the receiving time information of the ultra high frequency signal monitored by each sensor module and the sensor network position distribution data of the wireless transmission network are considered. Therefore, the trained partial discharge diagnosing model is adaptive to the solution of different GIS equipment and different sensors layout, without needing to independently performing model training for different transformer substations and different sensor layout solutions, thus having better model universality and applicability. A newly-built substation can directly apply the trained model without retraining, and only need to train a little after migrating the model, thus greatly saving the training time of the model and expediting the deployment of the partial discharge diagnosing model. Moreover, the model trained in the present disclosure accounts for the relationship between the position where partial discharge occurs and the sensor network position distribution. This allows the trained partial discharge diagnosing model of the present disclosure to eliminate interference from discharge signals occurring outside the GIS, enhancing the accuracy of partial discharge type identification.

BRIEF DESCRIPTION OF THE DRAWINGS

FIG. 8 is a flowchart of a GIS partial discharge diagnosing method according to an embodiment of the present disclosure.

DETAILED DESCRIPTION

Figure 1:
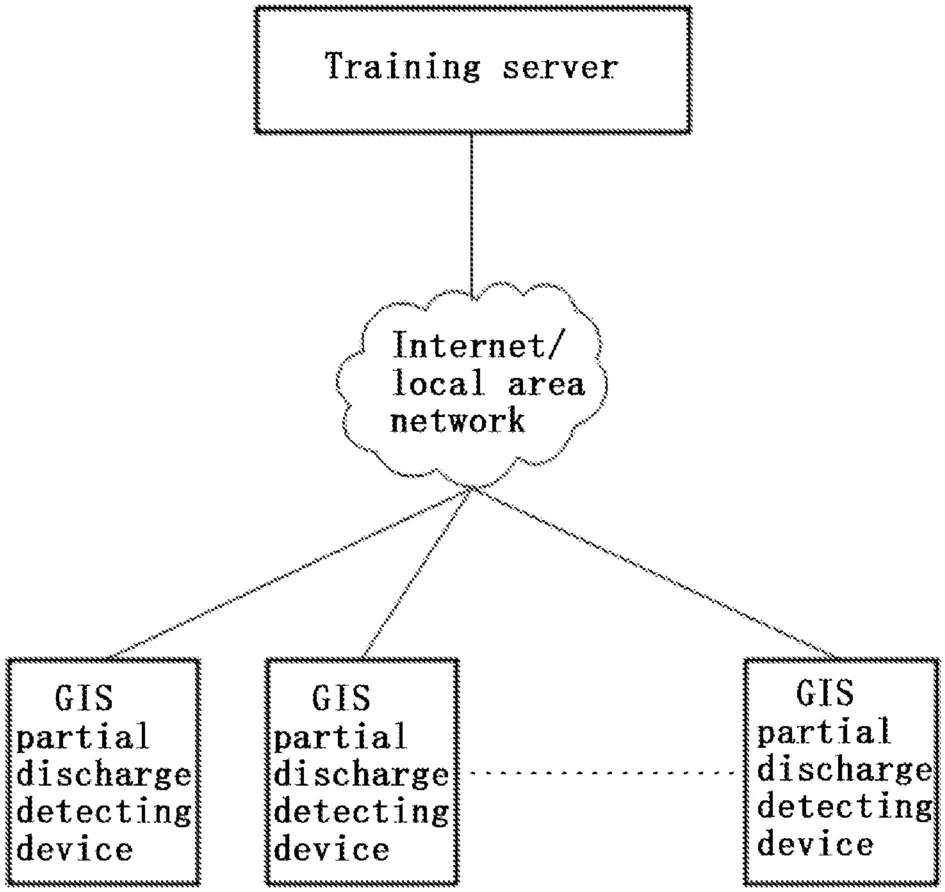
FIG. 1 is a schematic diagram of a global training system for a GIS partial discharge diagnosing model according to an embodiment of the present disclosure.

The present disclosure will be further described in conjunction with the accompanying drawings and the detailed embodiments hereinafter. The described embodiments shall not be constructed as limiting the present disclosure. All other embodiments obtained by those having ordinary skills in the art without creative work shall fall into the scope of protection of the present disclosure.

In the following description, the term "some embodiments" when referred to describes a subset of all possible embodiments, but it is understood that "some embodiments" may be the same subset or different subsets of all possible embodiments, and may be combined with each other without conflict.

At present, an ultrasonic detecting method and an ultra high frequency (UHF) method are mainly used for detecting the partial discharge in the GIS. The ultrasonic detecting method detects a partial discharge signal by detecting ultrasonic and vibration signals generated by the partial discharge with an ultrasonic probe, and measures a level of the partial discharge in the GIS. The ultra high frequency method detects the partial discharge signal by receiving an UHF electromagnetic wave signal in a range of 300-3000 MHz generated by the PD through an antenna, and then measures the partial discharge level in GIS.

Traditional partial discharge detection is performed by a worker using a portable partial discharge detector, which is limited by the experience of the worker, leading to inaccuracy in the detection of a partial discharge type. Furthermore, finding partial discharge manually not only requires a lot of labor costs, but also has low detection efficiency. An alternative involves the installation of sensors on the GIS for online partial discharge detection. Electrical signals detected by the sensors through antenna coupling are converted into discharge spectrum, and the worker may analyze the discharge spectrum to determine partial discharge types and approximate areas where the partial discharge occurs in the GIS. Because different partial discharge types have corresponding classical spectrum thereof, the worker may determine the partial discharge type by comparing with different types of discharge spectrum. Due to variations in GIS models, on-site conditions, and sensor placements, the partial discharge spectrum detected in the site may not necessarily match with the classical discharge spectrum in an ideal state, leading to inaccurate or unidentified detection. Moreover, the discharge phenomenon does not necessarily occur inside the GIS, and other external discharge signals, such as the interference of other external power equipment or lightning, may also result in a discharge phenomenon, and the discharge spectrum of interference from the external signal may also be similar to the classical spectrum, In this way, after the discharge type is identified, the worker can't find the problem during halt maintenance in the site, which leads to false detection, thus leading to high labor cost and causing many economic losses.

At present, there are also methods using AI, such as neural networks and machine learning, to automatically analyze and detect partial discharge in GIS, which can improve the identification rate of partial discharge types. However, due to variations in GIS structures and sensor installation locations among different models, the model built for training one GIS may not be suitable for another, thereby requiring separate training and model building for different GIS. This results in poor model universality and on-site applicability, leading to lengthy training periods and high training costs.

In order to solve the above technical problems, the present disclosure trains the partial discharge diagnosing model by introducing the receiving time information of the partial discharge ultra high frequency signal and the sensor network position distribution data of the wireless transmission network monitored by the sensor module. The partial discharge diagnosing model can be adaptive to a layout solution of different GIS equipment and different sensors, improve the accuracy of GIS partial discharge detection and the universality of the partial discharge diagnosing model, thus saving the training time and cost.

FIG. 1 shows a global training system for a GIS partial discharge diagnosing model provided by an embodiment of the present disclosure, wherein the global training system comprises a training server responsible for global training and a plurality of GIS partial discharge diagnosing devices, and the GIS partial discharge diagnosing devices are in communication with the training server through the Internet or a local area network. As transformer substations are usually located in different regions, and the GIS partial discharge diagnosing device is correspondingly arranged in the GIS of the transformer substation, the global training system of the embodiment of the present disclosure is actually responsible for remotely managing the GIS partial discharge diagnosing devices distributed in different regions. Some transformer substations are equipped with more than two GISs, so each GIS needs to be equipped with one GIS partial discharge diagnosing device, or the GIS partial discharge diagnosing device is only equipped for partial GISs according to the detection needs.

Figure 2:
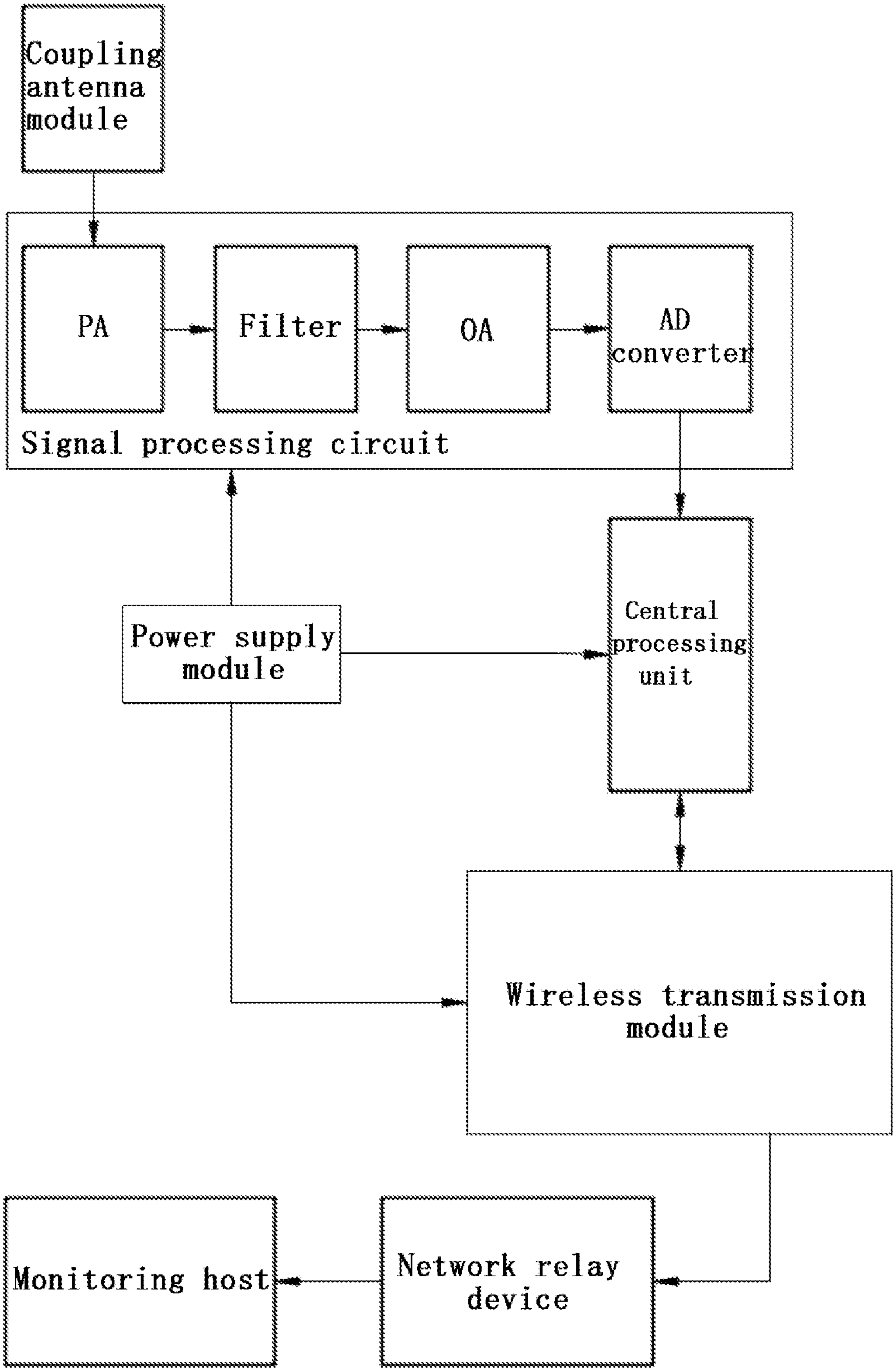
FIG. 2 is a structural schematic diagram of a GIS partial discharge diagnosing device according to an embodiment of the present disclosure.

Referring to FIG. 2, the GIS partial discharge diagnosing device comprises a monitoring host, a network relay device and a plurality of sensor modules distributed on the GIS, and the sensor modules are in communication with the monitoring host through the network relay device.

The sensor module comprises a coupling antenna module, a central processing unit, a signal processing circuit, a wireless transmission module and a coupling antenna module for detecting ultra high frequency signals when partial discharge occurs. The coupling antenna module is connected with the central processing unit through the signal processing circuit, and the wireless transmission module comprises a Bluetooth communication module and a 2.4g communication module, and the Bluetooth communication module and the 2.4g communication module are connected with the central processing unit. The signal processing circuit comprises a pre-amplifier (PA), a filter, an operational amplifier (OA) and an AD converter, an input end of the pre-amplifier is connected with the coupling antenna module, and an output end of the AD converter is connected with the central processing unit.

In an embodiment, the coupling antenna module is an ultra high frequency (UHF) sensor, the ultra high frequency sensor is used for capturing a discharge statistical feature in real time, the pre-amplifier is used for amplifying a real-time signal, the filter is used for shaping an amplified pulse signal, the operational amplifier is used for further amplifying the shaped pulse signal, the A/D converter is used for converting a shaped analog signal into a digital signal provided to the central processing unit, the central processing unit processes the digital signal of the discharge statistical feature to obtain the partial discharge ultra high frequency signal, and the partial discharge ultra high frequency signal is sent to the network relay device through the wireless transmission module.

Figure 3:
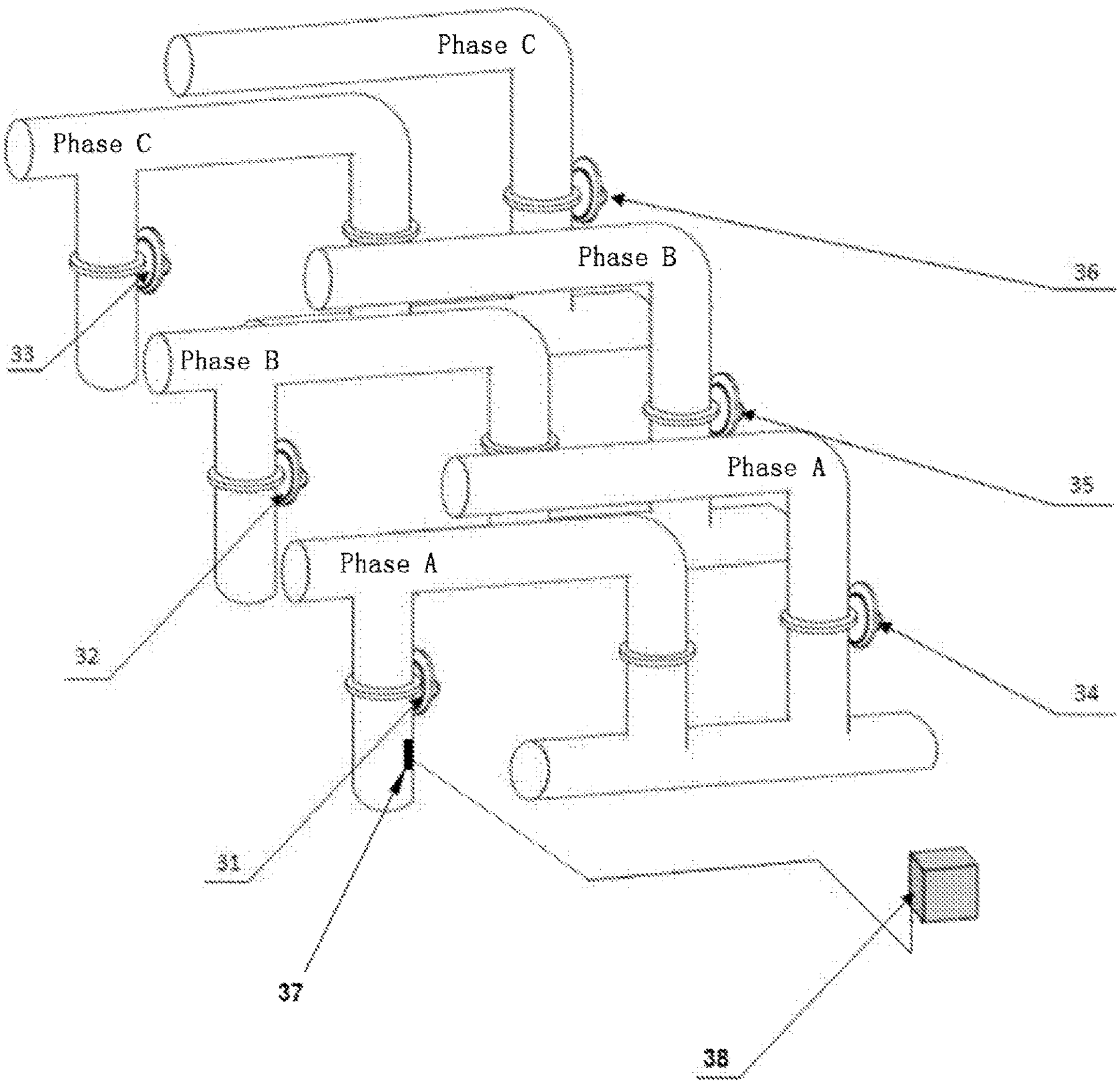
FIG. 3 is a schematic diagram of position distribution of a sensor module on a GIS according to an embodiment of the present disclosure.

The plurality of sensor modules are distributed on the GIS, and the distribution mode of sensors may be standardized according to the model of the GIS, or the sensor modules may be distributed according to the on-site layout of GIS. Referring to FIG. 3, it shows distribution of various sensor modules according to an embodiment. In the GIS as shown in FIG. 3, three sensor modules are provided, namely, a sensor module A 31, a sensor module B 32 and a sensor module C 33, wherein the sensor module A 31, the sensor module B 32 and the sensor module C 33 are respectively installed at a basin-type insulator where compartments of three phases of the GIS are connected with a bus bar, and the network relay device 37 is arranged at a position where the GIS compartment of phase A is connected with the bus bar, and is separated from the sensor module A 31 by a first preset distance L1. The network relay device 37 and the monitoring host 38 are connected by a wire.

Referring to FIG. 3, in another embodiment, six sensor modules are provided, namely, a sensor module A 31, a sensor module B 32, a sensor module C 33, a sensor module D 34, a sensor module E 35 and a sensor module F 36, wherein the sensor module A 31, the sensor module B 32 and the sensor module C 33 are respectively installed at a basin-type insulator where compartments for three phases of the GIS are connected with a bus bar. The sensor module D 34, the sensor module E 35 and the sensor module F 36 are respectively installed at a basin-type insulator in feeder line gas chambers of the compartments for three phases of GIS, and the network relay device 37 is arranged at a position where the GIS compartment in phase A is connected with the bus, and is separated from the sensor module A 31 by a first preset distance L1.

In the following embodiments, three sensor modules A, B, and C are illustrated. The layout of six and other numbers of sensor modules differs from that of three sensor modules in terms of the range of positions for detecting the number of the sensors, while the specific monitoring principle is similar.

Figure 4:
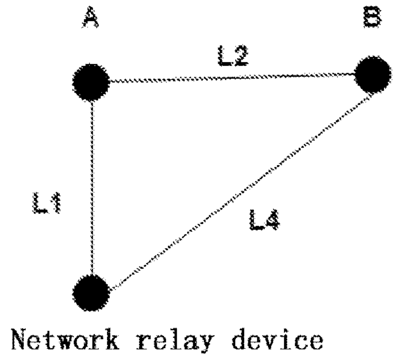
FIG. 4 is a simple schematic diagram of position and distance distribution of a sensor module and a network relay device according to an embodiment of the present disclosure.

Each sensor module has an ad-hoc network function, and may communicate with each other to establish a wireless transmission network. For example, after the sensor modules A, B and C are set as a group, the sensor modules A, B and C may find each other and establish communication connection for networking, in which grouping may be determined by setting a network identification number. For example, the network identification number of the sensor modules A, B and C is configured as Y1. After being powered on, the sensor module A will scan adjacent wireless devices, and determine the sensor module B and the sensor module C with the network identification number Y1, and then establish handshake connection. Because each sensor module will record a sending and receiving time and a time stamp when establishing the handshake connection, a time difference of signal transmission may be determined. Because the transmission speed of a wireless signal (generally the speed of light) is fixed, a distance between each two sensor modules may be determined. For example, the sensor module A may determine a distance thereof from the sensor module B as L2 and a distance thereof from the sensor module C as L3. Similarly, the distances of the sensor modules A, B and C from the network relay device may be determined. Because the network relay device is separated from the A sensor module by a fixed distance L1, the accurate positions of the sensor modules B and C may be determined. Referring to FIG. 4, a distance between the sensor modules A and B is measured as L2, and a distance between the sensor module B and the network relay device is L4. Therefore, in a triangle formed by the sensor modules A, B and the network relay device, side lengths of the triangle are known as L1, L2 and L4 respectively. For the convenience of understanding, FIG. 4 shows a plane schematic diagram of the sensor modules A, B and the network relay device, which may actually be extended to a three-dimensional coordinate system and will not be repeated here. It may be seen that the position of the sensor module B may be determined. In an embodiment, the position of the sensor module B may be determined by establishing the three-dimensional coordinate system between the network relay device and the sensor module A. In another embodiment, because the present disclosure is an application of the partial discharge diagnosing model, the position information input to the partial discharge diagnosing model may be different from the relative distance feature detected by the sensor module B, without calculating the accurate values of each sensor module. In fact, the partial discharge diagnosing model may work better by means of establishing a relative distance matrix.

In an embodiment, each sensor module is in an ad-hoc network with each other through a Bluetooth communication module to establish a wireless transmission network. The Bluetooth communication module has the characteristics of low power consumption, so that the Bluetooth communication module can reduce the power consumption of the sensor module, has the effect of energy saving and environmental protection, and is low in price. Although the Bluetooth communication module has the characteristics of slow data transmission speed and small bandwidth, the main function of the Bluetooth communication module in the embodiment is to establish a wireless transmission network, determine the distance between each two sensor modules, and only need to transmit the data needed for handshake communication in an actual working process. In an embodiment, each sensor module may maintain handshake communication, that is, continuously send data to confirm the position of the other sensor module and confirm whether the sensor module is online after establishing communication connection. The current 5.0 Bluetooth protocol has a function of concurrent connection. In another embodiment, each sensor module may establish communication connection by polling. Such mode is suitable for the early Bluetooth protocol. For example, when the sensor module A senses the sensor modules B and C nearby, the sensor module A firstly establishes communication connection with the sensor module B to determine the distance thereof from the sensor module B, then is disconnected with the sensor module B, is in communication with the sensor module C, and determines a distance thereof from the sensor module C. In an embodiment, the sensor module may be cyclically communicated with other sensor modules to maintain the wireless transmission network. In another embodiment, the sensor module may be connected with each sensor module only once to record and store the distance therebetween, and subsequent detections will all utilize this stored distance information (that is, the sensor network position distribution data remains unchanged after initialization). In an embodiment, each sensor module sends a partial discharge ultra high frequency signal and sensor network position distribution data to a network relay device through a wireless communication module. Due to the large amount of partial discharge ultra high frequency signals and the sensor network position distribution data, in order to obtain monitoring data in time, a 2.4g wireless communication module or WiFi, a 5g module is selected to communicate with the network relay device. Of course, the distance information between each sensor module and the network relay device may also be determined during the communication process.

In an embodiment, the sensor module further comprises a power supply module, the power supply module is connected with a central processing unit, a signal processing circuit, a wireless transmission module and a coupling antenna to provide power. In an embodiment, the power supply module may be powered through a commercial power supply (consistent with the power supply of the monitoring host). Alternatively, in an embodiment, the power supply module comprises a storage battery and a solar panel, and the storage battery is charged by the solar panel, and the sensor module is powered by the storage battery. In this way, it is not necessary to consider power supply leads of the sensor modules, so the layout of the sensor modules may be more flexible and adaptive to local conditions. By simply fixing the positions of the sensor modules, turning on switches of each sensor module, and supplying power to the sensor modules by the solar panel, each sensor module can be automatically networked and perform partial discharge monitoring. The operation is simple and the on-site layout is very convenient.

When the sensor module detects that GIS partial discharge occurs, it not only records the ultra high frequency signal, but also records a time when the ultra high frequency signal is received to get the receiving time information. It may be understood that the time when the ultra high frequency signal is detected by each sensor module is different according to different partial discharge positions, and the time when the ultra high frequency signal is detected by each sensor is also different according to different partial discharge types, so recording the receiving time information of each sensor module may help determine the partial discharge types.

In an embodiment, the network relay device is provided with two wireless communication modules, one is a Bluetooth communication module and the other is a 2.4g wireless communication module, wherein the 2.4g wireless communication module and the Bluetooth communication module are arranged at a distance L5, and each sensor module is in communication with both the Bluetooth communication module of the network relay device and the 2.4g wireless communication module of the network relay device. Therefore, the distance between the 2.4g wireless communication module and the sensor module and the distance between the Bluetooth communication module of the network relay device and the sensor module may be determined respectively, and the specific three-dimensional coordinate relationship of each sensor module may be determined based on that the network relay device is separated from the A sensor module by a fixed distance LL.

The network relay device is in communication with the monitoring host, and the communication may be conducted in a wired or wireless way. Due to the large data transmission between the network relay device and the monitoring host, for the wired way, a network cable or a coaxial optical cable may be used for connection, and for the wireless way, it may be implemented by means of WiFi or 5g communication.

In an embodiment, the monitoring host is used for monitoring and analyzing the partial discharge type, that is, for determining the predicted partial discharge type. The monitoring host obtains the monitoring data of each sensor module through the network relay device, inputs the monitoring data into the partial discharge diagnosing model for prediction processing, and determines the predicted partial discharge type. The monitoring data comprises partial discharge ultra high frequency signals monitored by each sensor module, receiving time information of partial discharge ultra high frequency signals monitored by each sensor module and sensor network position distribution data of the wireless transmission network. The monitoring host may be computer equipment or server equipment.

In an embodiment, the monitoring host also analyzes the ultra high frequency signals detected by each sensor module to determine a signal amplitude difference between the ultra high frequency signals detected by the sensor modules or a difference between the measurement items in the discharge spectrum of each sensor module, and then determine the signal attenuation feature, that is, the above monitoring data also comprises signal attenuation feature after the monitoring host analyzes and processes the ultra high frequency signals.

The above-mentioned partial discharge diagnosing model may only be used after training, and the training of the partial discharge diagnosing model is also carried out using the global training system of the GIS partial discharge diagnosing model shown in FIG. 1 and FIG. 2, wherein the GIS partial discharge diagnosing device is responsible for the training of the specific partial discharge diagnosing model.

Figure 5:
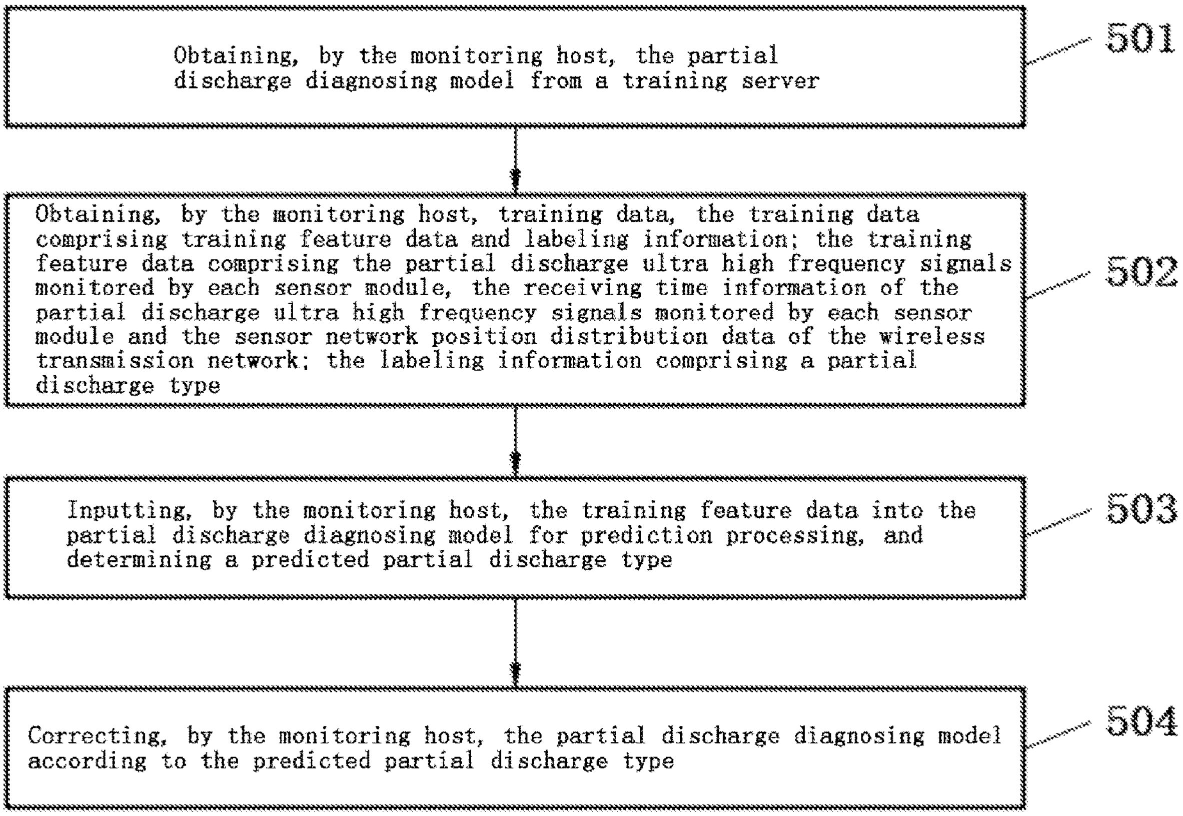
FIG. 5 is a flowchart of a training method for a GIS partial discharge diagnosing model according to an embodiment of the present disclosure.

Referring to FIG. 5, an embodiment of the present disclosure provides a training method for GIS partial discharge diagnosing model, comprising the following steps.

Step 501, obtaining, by the monitoring host, the partial discharge diagnosing model from a training server.

In this step, the monitoring host is in communication with the training server to obtain a partial discharge diagnosing model, wherein the partial discharge diagnosing model may be an original model, a standard model or a migrated training model. In an embodiment, the training model obtained by the monitoring host is a model trained by other GIS partial discharge diagnosing devices in the global training system, or a model migrated from the training of other GIS partial discharge diagnosing devices.

Step 502, obtaining, by the monitoring host, training data, the training data comprising training feature data and labeling information; the training feature data comprising the partial discharge ultra high frequency signals monitored by each sensor module, the receiving time information of the partial discharge ultra high frequency signals monitored by each sensor module and the sensor network position distribution data of the wireless transmission network; the labeling information comprising a partial discharge type.

In this step, the monitoring host may obtain training data in at least one of the following ways.

In an embodiment, training data is obtained from a training server, wherein the training data is the data previously collected in other GIS partial discharge detecting devices. As described above, the global training system according to the embodiments of the present disclosure is distributed in different regions and different transformer substations, so the obtained training data may be the training data generated by other GIS partial discharge detecting devices when performing training tasks alone, or the data collected when the partial discharge fault occurs in operation process of the GIS from other transformer substations, and these data are uploaded to the training server as the training data of other GIS partial discharge detecting devices. On one hand, training resources can be effectively used and training costs can be saved, on the other hand, the diversity of training data can be improved to make the partial discharge diagnosing model more applicable.

In another embodiment, the training data is obtained from the memory of the monitoring host, wherein the training data is the data previously collected by the current GIS partial discharge diagnosing device. In this embodiment, a GIS partial discharge diagnosing device is arranged in a GIS at first, and then partial discharge ultra high frequency signals of several sensor modules, sensor network position distribution data and receiving time information are generated in the GIS operation process. Because it is usually necessary to manually check the occurrence position and type of partial discharge after each partial discharge failure, a piece of training data is formed. Because the global training system may comprise hundreds of GIS partial discharge diagnosing devices, the stored training data may also be shared by the training server to realize resource sharing.

In another embodiment, the training data may be collected via testing by artificially simulating partial discharge. After a GIS partial discharge diagnosing device is arranged on a GIS, equipment for simulating to generate the partial discharge may be arranged on the GIS (for safety reasons, the GIS partial discharge equipment is not put into use in the power grid at the time), which may be artificially generating partial discharge by simulating partial discharge, or be an ultra high frequency signal generated by simulating the partial discharge. The training data may be obtained by simulating the partial discharge by releasing the ultra high frequency signal, by collecting the ultra high frequency signal generated by the partial discharge generator detected by each sensor module, and recording the time when each sensor module receives the ultra high frequency signal and the sensor network position distribution data sensed by each sensor module communicating with each other, and determining the partial discharge type when arranging the partial discharge generator.

In another embodiment, the training data is obtained through a partial discharge simulation model established by a computer, wherein the training data is simulated test data.

In an embodiment, the methods for obtaining training data in the above different embodiments may be combined, for example, obtaining the training data collected by other GIS partial discharge diagnosing devices from the training server, and collecting artificially simulated on-site partial discharge training data.

In step 502, the training data comprises training feature data and labeling information, wherein the partial discharge ultra high frequency signal in the training feature data is a discharge statistical feature of the discharge signal, and the monitoring host will count the discharge signals detected by each sensor module to obtain the above-mentioned discharge statistical feature as the partial discharge ultra high frequency signal. In an embodiment, the partial discharge ultra high frequency signal is the first discharge spectrum. For example, a phase resolved partial discharge (PRPD) spectrum or a phase resolved pulse sequence (PRPS) spectrum may be adopted, wherein the PRPD displays a pulse signal (with phase) generated by partial discharge in a two-dimensional coordinate system, and the PRPS displays a pulse signal with phase generated by partial discharge in a three-dimensional coordinate system in time sequence. In another embodiment, the PRPD spectrum and PRPS spectrum may be used in combination (that is, both the PRPD spectrum and the PRPS spectrum are used as partial discharge ultra high frequency signals in training data), which may improve the accuracy of training and model identification. The partial discharge training data is represented using digital signal coding, which is represented by a feature G in the present disclosure. For the receiving time information in the training data, it may be arranged in sequence according to the serial number of the sensor modules. Taking three sensor modules A. B and C as an example, it may be denoted as a feature T ($T_A$, $T_B$, $T_C$). For the sensor network position distribution data of each sensor module, it may be denoted as the relative distance of each sensor module. Taking three sensor modules A, B and C as an example, the distances between the sensor module A and the network relay device, between the sensor module A and the sensor module B. and between the sensor module B and the sensor module C may be denoted as $L_{ax}$, $L_{ab}$ and $L_{ac}$ respectively, and so on for other sensors. Therefore, in an embodiment, the training feature data in the training data may be shown in the following table:

TABLE 1

Schematic diagram of training feature data format

| Serial No. Of sensor module | Partial discharge ultra high frequency signal | Receiving time information | Distance from network relay device | Distance between the first serial No. And the second serial No. (distance AB) | Distance between the first serial No. And the third serial No. (distance AC) | Distance between the second serial No. And the third serial No. (distance BC) |
|---|---|---|---|---|---|---|
| A | G | $T_A$ | $L_{ax}$ | $L_{ab}$ | $L_{ac}$ | N |
| B | | $T_B$ | $L_{bx}$ | $L_{ba}$ | N | $L_{bc}$ |
| C | | $T_C$ | $L_{cx}$ | N | $L_{ca}$ | $L_{cb}$ |

The symbol "N" in Table 1 indicates absence of measurement data. With the number of sensors increases, the table may be extended further. For example, when a sensor module D is added. Table 1 will include columns for distance AD, distance BD and distance CD, and so on. In the actual training process, in order to adapt to more sensor modules, a greater number of columns in the table are reserved by default. For example, 20 columns are reserved for relative distance data, but the actual application only involves a small number of sensor modules, then the columns without data may be filled with "N" to indicate the absence of data. For example, in the 20 columns for relative distance data, only columns AB, AC, and BC have data, while the rest are filled with "N".

Of course, in another embodiment, the sensor network position distribution data may not be represented by the relative distance between each two sensor modules, or the three-dimensional coordinates of each sensor may be determined by establishing a coordinate system. However, after practical analysis, the applicant found that the representation mode of relative position has higher success rate in training the partial discharge diagnosing model and makes the model more applicable.

In step 502, the labeling information comprises partial discharge types. In an embodiment, the labeling information may comprise the following types:

(1) discharge of free metal particles;

(2) discharge of suspended potential body, (3) air gap discharge inside the insulator, (4) discharge of metal tip;

(5) mechanical vibration (non-partial discharge); and (6) external interference signals.

In an embodiment, the partial discharge type may also be marked by a feature, for example, the above-mentioned different labels are used for marking the partial discharge type, either with number or text.

Step 503, inputting, by the monitoring host, the training feature data into the partial discharge diagnosing model for prediction processing, and determining a predicted partial discharge type.

In this step, the training feature data obtained in step 502 on the monitoring host is input to the partial discharge diagnosing model obtained in step 501 for prediction processing. In an embodiment, the monitoring host will pre-process the training feature data according to input requirements of the partial discharge diagnosing model and then input it to the partial discharge diagnosing model. In an embodiment, the monitoring host first vectorizes the training feature data to obtain a vectorized representation of the feature data and then inputs it to the partial discharge diagnosing model. In another embodiment, when the training feature data obtained in step 502 is already vectorized data, the monitoring host does not need to process the training feature data and may directly input the training feature data into the partial discharge diagnosing model. Because the training feature data further comprises other types of receiving time information and sensor network position distribution data besides the partial discharge ultra high frequency signal. In an embodiment, the monitoring host may concatenate or combine the receiving time information, the sensor network position distribution data and the partial discharge ultra high frequency signal, wherein concatenating means that the partial discharge ultra high frequency signal, the receiving time information and the sensor network position distribution data are vectorized respectively and then concatenated, and combining means, for example, converting the data in Table 1 into matrix data expressed in rows and columns, and then vectorizing matrix data.

After the training feature data is input into the partial discharge diagnosing model, the partial discharge diagnosing model outputs the partial discharge type after prediction processing.

Step 504, correcting, by the monitoring host, the partial discharge diagnosing model according to the predicted partial discharge type.

In this step, cross entropy is calculated by comparing the labeling information with the predicted partial discharge type, and then parameters of the relationship target model are updated by a BP (Backpropagation) algorithm. The input-output relationship of a BP network is essentially a mapping relationship; a function of a BP neural network with one input and m outputs is a continuous mapping from one-dimensional Euclidean space to a finite field in m-dimensional Euclidean space, which is highly nonlinear. The information processing ability comes from multiple compounding of simple nonlinear functions, so it has a strong function reproduction ability, which is the basis for the application of the BP algorithm. The back propagation algorithm mainly involves repeated cyclic iteration of two steps (incentive propagation and weight updating), until the response of the network to the input reaches the predetermined target range. At the stage of model learning, if an expected output value is not obtained at an output layer, the sum of squares of the output and the expected error is taken as an objective function, and is converted into the back propagation, and a partial derivative of the objective function to the weights of each neuron is calculated layer by layer to form a gradient of the objective function to a weight vector, which is used as the basis for modifying the weights. The network learning is completed in the process of modifying the weights, and when the error reaches the expected value, the network learning is finished.

In the training method for a GIS partial discharge diagnosing model provided by the embodiments of the present disclosure, because the sensor modules in the GIS partial discharge diagnosing device are in communication with each other, the positions of the sensor modules relative to each other and to the network relay device can be determined according to the communication duration, so that the sensor network position distribution data of each sensor module in the wireless transmission network can be determined. Moreover, because the distance of the GIS partial discharge position from each sensor module is different, the time when each sensor module receives the partial discharge ultra high frequency signal is also different, which reflects the relationship between the actual partial discharge position and the sensor network position, and can also better amplify the difference between external interference electrical signals and GIS internal partial discharge signals. In the training process of the partial discharge diagnosing model, the receiving time information of the ultra high frequency signal monitored by each sensor module and the sensor network position distribution data of the wireless transmission network are considered. Therefore, the trained partial discharge diagnosing model is adaptive to the solution of different GIS equipment and different sensors layout, without needing to independently performing model training for different transformer substations and different sensor layout solutions, thus having better model universality and applicability. A newly-built substation can directly apply the trained model without retraining, and only need to train a little after migrating the model, thus greatly saving the training time of the model and expediting the deployment of the partial discharge diagnosing model. Moreover, the model trained in the present disclosure accounts for the relationship between the position where partial discharge occurs and the sensor network position distribution. This allows the trained partial discharge diagnosing model of the present disclosure to eliminate interference from discharge signals occurring outside the GIS, enhancing the accuracy of partial discharge type identification.

In an embodiment, the monitoring host also analyzes the ultra high frequency signals detected by each sensor module to determine a signal amplitude difference between the ultra high frequency signals detected by the sensor modules or a difference between the measurement items in the discharge spectrum of each sensor module, and then determine the signal attenuation feature, that is, the above monitoring data also comprises a signal attenuation feature after the monitoring host analyzes and processes the ultra high frequency signals. The signal attenuation feature comprises the signal amplitude difference between the ultra high frequency signals detected by each sensor module or the difference between each two measurement items in the discharge spectrum of each sensor module. Because the signal attenuation difference detected by each sensor module may be represented by the relative distance similar to that in Table 1, for example, a column for feature representation may be added, such as signal attenuation feature SA between the sensor module A and the sensor module B. and so on. In an embodiment of the present disclosure, the partial discharge ultra high frequency signal is shown by means of the discharge spectrum, and the discharge spectrum has integrated the discharge signal feature of each sensor module (for example, the sensor modules A, B and C in Table 1 share the partial discharge ultra high frequency signal feature G). In this embodiment, by extracting the attenuation features between the sensor modules in the partial discharge ultra high frequency signal, the difference features between the sensor modules are introduced, which enriches the training dimension of training feature data and has a better training effect on the partial discharge diagnosing model. In an embodiment, the attenuation feature may be concatenated with the partial discharge ultra high frequency signal, the receiving time information and the sensor network position distribution data, or combined with the above items in a matrix manner, and then input it into the partial discharge diagnosing model for prediction processing.

In an embodiment, the sensor module is an external sensor module as shown in FIG. 3, and the external sensor module is used for facilitating the upgrading of the existing GIS. For example, the existing GIS does not have a function of on-line detection on partial discharge, and the function may be upgraded through the GIS partial discharge diagnosing device in the embodiment of the present disclosure. In an embodiment, the GIS comprises a plurality of preset sensors arranged inside a GIS pipeline, and the preset sensors are also used for detecting ultra high frequency signals generated when GIS partial discharge occurs. However, these preset sensors are not equipped with wireless transmission devices, so the mutual position relationship between the preset sensors cannot be perceived. For these GISs, upgrading may be realized by adding a GIS partial discharge diagnosing device. Meanwhile, the on-line detection data of the original preset sensors may also be used only by connecting wired interfaces of the original preset sensors to the monitoring host in the embodiment of the present disclosure. When partial discharge occurs, each external sensor module may detect the partial discharge ultra high frequency signal, and each preset sensor arranged in the GIS may also detect the ultra high frequency signal, thereby the monitoring host may analyze and statistically process the detected data of each preset sensor to obtain a second discharge spectrum. Therefore, the second discharge spectrum may also be used for training the partial discharge diagnosing model to improve the prediction accuracy of the partial discharge diagnosing model. Correspondingly, the second discharge spectrum may be concatenated with the partial discharge ultrahigh frequency signal, the receiving time information and the sensor network position distribution data, or combined with the above items in a matrix mode, and then input it into the partial discharge diagnosing model for prediction processing.

Figure 6:
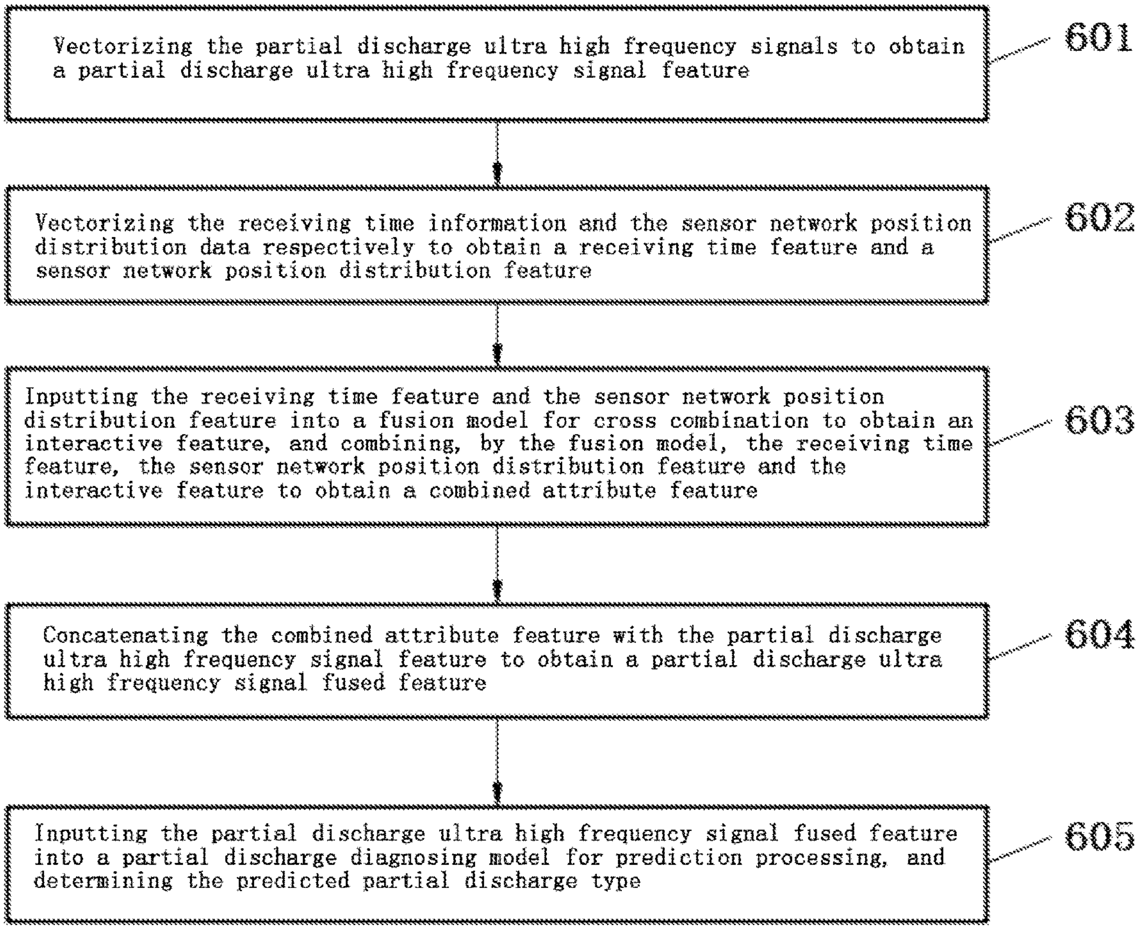
FIG. 6 is a detailed flowchart of step 503 of FIG. 5.

Referring to FIG. 6, in an embodiment, the step 503 specifically comprises the following steps.

Step 601, vectorizing the partial discharge ultra high frequency signals to obtain a partial discharge ultra high frequency signal feature.

In this step, the monitoring host performs vectorization processing on the partial discharge ultra high frequency signal to obtain the partial discharge ultra high frequency signal feature. In an embodiment, the partial discharge ultra high frequency signal is a discharge spectrum (such as PRPD spectrum or PRPS spectrum) counted by the monitoring host according to the ultra high frequency discharge signals detected by each sensor module. Because the discharge spectrum features are image features, vectors may be used for representing each sampled pixel, and then the partial discharge ultra high frequency signal may be converted into the partial discharge ultra high frequency signal feature. If there are multiple spectrum data, such as PRPD spectrum, PRPS spectrum and the second discharge spectrum monitored by internal sensors of GIS, and the signal attenuation feature between the sensor modules, the features may be concatenated or weighted to obtain the partial discharge ultra high frequency signal feature. In an embodiment, if the partial discharge ultra high frequency signal is not represented by a spectrum, the corresponding digital signal may be input into a depth sequence model for vectorization.

Step 602, vectorizing the receiving time information and the sensor network position distribution data respectively to obtain a receiving time feature and a sensor network position distribution feature.

In this step, the vectorization processing of the receiving time information and the sensor network position distribution data may refer to step 601, and will not be repeated here.

Step 603, inputting the receiving time feature and the sensor network position distribution feature into a fusion model for cross combination to obtain an interactive feature, and combining, by the fusion model, the receiving time feature, the sensor network position distribution feature and the interactive feature to obtain a combined attribute feature.

In this step, the fusion model is a pre-trained machine learning model for fusing and interacting the input receiving time feature and the sensor network position distribution feature. The fusing and interacting process includes: cross-combining the receiving time feature and the sensor network position distribution feature to form an interactive feature, and then combining the receiving time feature, the sensor network position distribution feature and the interactive feature using the fusion model to obtain a combined attribute feature. That is to say, the combined attribute feature comprises the receiving time feature, the sensor network position distribution feature and the interactive feature generated from the cross combination of the receiving time feature and the sensor network position distribution feature.

Step 604, concatenating the combined attribute feature with the partial discharge ultra high frequency signal feature to obtain a partial discharge ultra high frequency signal fused feature.

In this step, the monitoring host concatenates the combined attribute feature with the partial discharge ultra high frequency signal feature to obtain the partial discharge ultra high frequency signal fused feature. In an embodiment, the combined attribute feature may be concatenated at the tail of the partial discharge ultra high frequency signal feature.

Step 605, inputting the partial discharge ultra high frequency signal fused feature into a partial discharge diagnosing model for prediction processing, and determining the predicted partial discharge type.

In this step, the prediction processing method has been described in step 503, and will not be repeated here.

In an embodiment, based on step 601 to step 605, the above step 504 comprises the step of:

correcting the partial discharge diagnosing model and the fusion model according to the predicted partial discharge type.

In this step, the partial discharge diagnosing model and the fusion model may be jointly trained to adjust the parameters of each model, or to be independently trained to adjust the parameters of a learning model, for example, to independently adjust the parameters of the partial discharge diagnosing model. Alternatively, one model may be fixed, while the parameters of other learning models may be trained. For example, the partial discharge diagnosing model may be fixed, while the fusion model is jointly trained.

In the embodiment of the present disclosure, cross fusion is further performed for the receiving time feature and the sensor network position distribution feature. Because the position where the partial discharge occurs has a strong correlation with the sensor network position distribution and the time when each sensor module receives the partial discharge signal, especially when the discharge signal is an external interference signal, the sensor network position distribution has a high sensitivity for detecting the position of the external signal. Moreover, by cross-fusing the receiving time feature and the sensor network position distribution feature, an interactive feature may be obtained, which may effectively extract the correlation between the two features, and then the fusion model combines the receiving time feature, the sensor network position distribution feature and the interactive feature to obtain the combined attribute feature, which can also protect the independent features of the receiving time feature and the sensor network position distribution feature. In the embodiment of the present disclosure, it is not just a simple extraction and concatenation of the spatial-temporal features. Instead, it involves selecting a ratio between the receiving time feature, the sensor network position distribution feature and the interactive feature through the fusion model. Moreover, by jointly training the partial discharge diagnosing model and the fusion model, the training effect of the model can be improved and the prediction accuracy of the partial discharge diagnosing model can be greatly improved.

In an embodiment, the step of combining, by the fusion model, the receiving time feature, the sensor network position distribution feature and the interactive feature to obtain a combined attribute feature may include combing the receiving time feature, the sensor network position distribution feature and the interactive feature by weighting and summing, which may be specifically expressed as:

$$S_P = W_0 + W_1 d_1 + W_2 d_2 + W_3 d_1 d_2$$

wherein $S_P$ is the combined attribute feature, $W_0$, $W_1$, $W_2$ and $W_3$ are parameters of the fusion model, $d_1$ is a value of the receiving time feature, and $d_2$ is a value of the sensor network position distribution feature. In an embodiment, $d_1$ and $d_2$ are matrix, correspondingly, $W_0$, $W_1$ and $W_2$ are also matrix weights.

The fusion model can further strengthen the interaction between the position distribution attribute and the receiving time attribute by creatively introducing a cross term and addressing the problem of the cross term parameter system by using a latent vector, which can better extract the low-order terms in the sample.

In an embodiment, the accuracy of labeling the partial discharge types in the labeling information can be improved through the prediction results of the partial discharge diagnosing model. As described in the above embodiment, the training data may be collected in the GIS operation process: when the GIS partial discharge occurs, the monitoring host or the training server obtains the partial discharge ultra high frequency signal monitored by each sensor module, and generates a monitored discharge spectrum according to the ultra high frequency signal, and the monitoring host compares the monitored discharge spectrum with the classical discharge spectrum to determine the occurrence type of the partial discharge generating type and the partial discharge type in the labeling information, thereby generating a piece of training data. In an embodiment, the monitoring host compares the similarity between the monitored discharge spectrum and different classical discharge spectrum according to a similarity algorithm, and then determines the occurrence type of the partial discharge. In another embodiment, the monitoring host may display the monitored discharge spectrum, so that a worker with relevant experience may compare the monitored discharge spectrum with the classical discharge spectrum, and the worker may determine the occurrence type of the partial discharge by manually comparing with the classical discharge spectrum. Based on this, in an embodiment, the training method for a GIS partial discharge diagnosing model further comprises the following step.

Step 505, comparing the predicted partial discharge type with the partial discharge type in the labeling information to determine a prediction accuracy rate of the partial discharge diagnosing model in the current training step; and when the prediction accuracy rate is greater than a preset value, generating a target discharge spectrum based on the partial discharge ultra high frequency signals in the training feature data, and updating the classical discharge spectrum according to the target discharge spectrum.

This step involves further utilization of the output of the partial discharge diagnosing model and the error compared to the expected result in step 504. When the prediction accuracy rate (that is, the ratio of the error to the expectation) of the prediction results output by the partial discharge diagnosing model compared to the labeling information reaches a preset value, for example, 90% to 100%, it indicates a high prediction accuracy rate for the partial discharge diagnosing model, and the corresponding target discharge spectrum is generated based on the ultra high frequency signals with the high prediction accuracy rate, so as to update the classical discharge spectrum. For example, during model prediction training with 1000 pieces of data, when the prediction accuracy rate of the partial discharge diagnosing model reaches 90% after training of 890 pieces of data, the partial discharge diagnosing model will continue to be trained, and at the same time, the training data with the prediction accuracy rate higher than 90% will be extracted to generate the corresponding target discharge spectrum to update the classical discharge spectrum.

Because the labeling information in the embodiment of the present disclosure is labeled with reference to the discharge spectrum based on a classical theory, the labeling information is only relatively accurate, but not absolutely correct. However, the partial discharge ultra high frequency signal monitored by the sensor module follows the natural objective law. Therefore, the classical discharge spectrum may be updated and maintained according to the natural objective law, which makes it closer to reality. The whole model training constitutes an iterative updating state similar to a closed loop, which makes the prediction result closer to reality and makes the whole model training easier to converge. In an embodiment, training feature data with a prediction accuracy rate of over 90% may be collected, and the training feature data may be analyzed, counted or extracted to determine a new classical discharge spectrum. In another embodiment, the current classical discharge spectrum may be corrected using the training feature data with a prediction accuracy rate of over 90% to determine a new classical discharge spectrum, so as to further improve the prediction effect of the partial discharge diagnosing model.

The embodiment of the present disclosure provides a training device for a GIS partial discharge diagnosing model, so that the GIS partial discharge diagnosing device is applied to the training method of the GIS partial discharge diagnosing model in the above embodiments.

Figure 7:
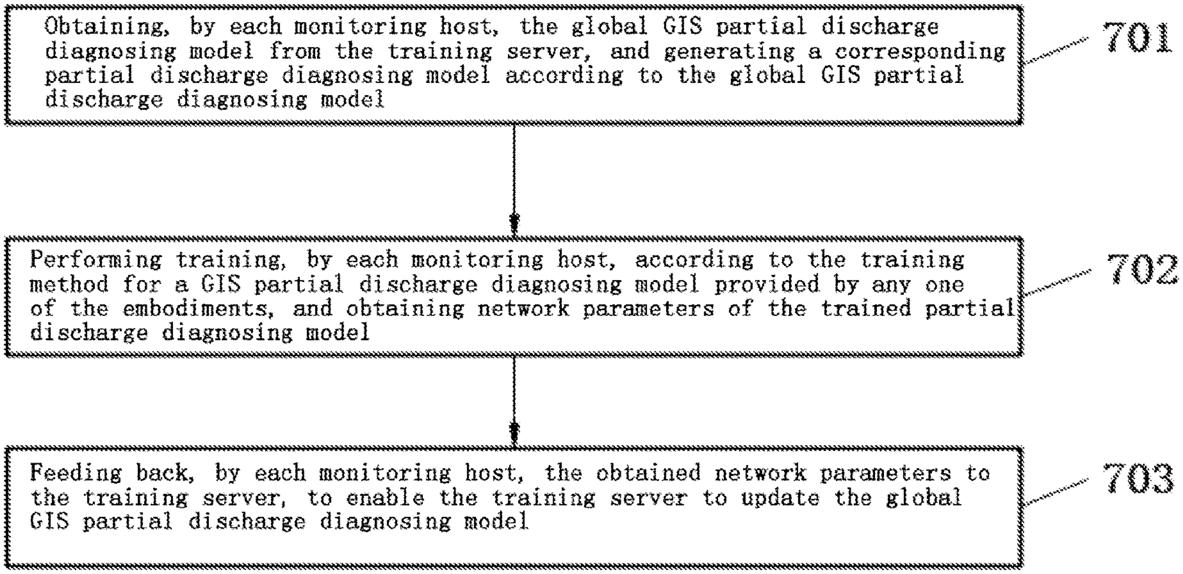
FIG. 7 is a flowchart of a global training method for a GIS partial discharge diagnosing model according to an embodiment of the present disclosure.

Referring to FIG. 7, an embodiment of the present disclosure provides a global training method for a GIS partial discharge diagnosing model applied to the global training system as shown in FIG. 2, wherein the training server is configured with a global GIS partial discharge diagnosing model, and the global training method comprises the following steps.

Step 701, obtaining, by each monitoring host, the global GIS partial discharge diagnosing model from the training server, and generating a corresponding partial discharge diagnosing model according to the global GIS partial discharge diagnosing model.

In this step, each monitoring host in the global training system obtains the GIS partial discharge diagnosing model from the training server.

Step 702, performing training, by each monitoring host, according to the training method for a GIS partial discharge diagnosing model provided by any one of the above embodiments, and obtaining network parameters of the trained partial discharge diagnosing model.

Step 703, feeding back, by each monitoring host, the obtained network parameters to the training server, to enable the training server to update the global GIS partial discharge diagnosing model.

In this step, the network parameters comprise gradient parameters of the GIS partial discharge diagnosing model.

In the global training method provided by the embodiment of the present disclosure, the model training may be performed in parallel by the monitoring hosts in a plurality of GIS partial discharge diagnosing devices, and each monitoring host feeds back the network parameters of the partial discharge diagnosing model to the training server, so as to update the global GIS partial discharge diagnosing model in the training server. In an embodiment, each monitoring host that is being trained obtains the latest global GIS partial discharge diagnosing model from the training server each time, and updates the partial discharge diagnosing model stored in the monitoring host based on the global GIS partial discharge diagnosing model. Because the partial discharge diagnosing model comes from the training results of all GIS partial discharge diagnosing devices, the training effect of the partial discharge diagnosing model can be improved. Although the updated partial discharge diagnosing model will reduce the accuracy of the current prediction results and prolong the training time, the applicability of the partial discharge diagnosing model will be increased (considering different types of GISs and different sensor module distribution modes), and can improve the adaptability and diversity of the partial discharge diagnosing model. With the goal of training the partial discharge diagnosing model with better applicability, the training efficiency of the partial discharge diagnosing model can be greatly increased and the prediction accuracy and applicability of the partial discharge diagnosing model can also be improved. The above-mentioned global training solution is especially suitable for the training data collection mode of on-site artificial simulated partial discharge testing, and the training time can be effectively reduced in the scenario where multiple GIS partial discharge diagnosing devices are trained at the same time.

Referring to FIG. 8, a GIS partial discharge diagnosing method is provided in the embodiment of the present disclosure, which is an application of the GIS partial discharge diagnosing device to the trained partial discharge diagnosing model in the above embodiments, and may include the following steps.

Step 801, obtaining, by the monitoring host, monitoring data of each sensor module, the monitoring data comprising partial discharge ultra high frequency signals monitored by each sensor module, receiving time information of the partial discharge ultra high frequency signals monitored by each sensor module and sensor network position distribution data of the wireless transmission network.

In this step, the monitoring host obtains the monitoring data of each sensor module through the network relay device, and the specific mode of obtaining the monitoring data may refer to the structural description of the GIS partial discharge diagnosing device above, and will not be repeated here. Because the application input data of the partial discharge diagnosing model needs to be consistent with the data during training in terms of the data format, the data format of the monitoring data in this embodiment may refer to the description of the training feature data in step 502. For example, the partial discharge ultra high frequency signal may be a discharge signal spectrum (PRPS or PRPD, or both PRPS and PRPD), or may comprise a second discharge spectrum monitored by a preset sensor. The data format of the monitoring data is also completely consistent with the format of the training feature data in Table 1 and the description of the related embodiments thereof.

Step 802, inputting, by the monitoring host inputs the monitoring data into a partial discharge diagnosing model for prediction processing, and determines a predicted partial discharge type.

In this step, the monitoring host inputs the monitoring data into the partial discharge diagnosing model for prediction processing, which is the same as the processing of training feature data in step 503 and the related embodiments thereof. Moreover, the processing of the receiving time information and the sensor network location distribution data of the wireless transmission network may also refer to the same processing in step 503 and the related embodiments thereof, the steps 601 to 604 and the related embodiments thereof in the above embodiments, which will not be repeated here.

An embodiment of the present disclosure further provides electronic device, comprising a memory and a processor, the memory stores a computer program, the processor performs the computer program to implement the training method for a GIS partial discharge diagnosing model, the global training method for a GIS partial discharge diagnosing model or the GIS partial discharge diagnosing method.

An embodiment of the present disclosure further provides a computer readable storage medium storing a program which, when executed by a processor, causes the processor to implement the training method for a GIS partial discharge diagnosing model, the global training method for a GIS partial discharge diagnosing model or the GIS partial discharge diagnosing method.

An embodiment of the present disclosure further provides a computer program product or a computer program, wherein the computer program product or the computer program comprises a computer instruction stored in a computer readable storage medium. A processor of a computer device reads the computer instruction from the computer readable storage medium, the processor performs the computer instruction to enable the computer device to perform and implement the training method for a GIS partial discharge diagnosing model, the global training method for a GIS partial discharge diagnosing model or the GIS partial discharge diagnosing method.

The terms “first”, “second”, “third”, “fourth” and the like (if any) in the specification and the above drawings of the present disclosure are used to distinguish similar objects, and are not necessarily used to describe a specific sequence or a chronological order. It should be understood that the data used in this manner may be interchanged where appropriate, so that the embodiments of the present disclosure described herein can be implemented in an order other than those illustrated or described herein. In addition, the terms “comprise” and “have” and any variations thereof are intended to cover a non-exclusive inclusion, for example, a process, method, system, product, or device that includes a series of steps or units is not necessarily limited to those steps or units that are explicitly listed, but may include other steps or units that are not explicitly listed or inherent to such process, method, product or device.

It should be understood that in the present disclosure, “at least one (item)” means one or more, and “a plurality of” means two or more. “And/or” is used for describing an association relationship of associated objects, indicating that there may be three relationships, for example, “A and/or B” may indicate: three situations that there are only A, only B and both A and B, wherein A and B may be singular or plural. The character “/” generally indicates that the associated objects are in an “or” relationship. “At least one of” and similar expressions refer to any combination of these terms, including any combination of a singular term or plural terms. For example, at least one of a, b or c may indicate a, b or c, “a and b”, “a and c”, “b and c”, or “a, b and c”, wherein a, b and c may be singular or plural.

In the several embodiments provided in the present disclosure, it should be understood that the disclosed systems, devices and methods may be implemented in other ways. For example, the device embodiments described above are merely illustrative. For example, the division of the units is only one logical function division. In practice, there may be another division manner. For example, multiple units or components may be combined or integrated into another system, or some features may be ignored or not performed. In addition, the illustrated or discussed mutual coupling or direct coupling or communication connection may be indirect coupling or communication connection through some interfaces. The indirect coupling or communication connection between apparatuses or units may be in electrical, mechanical or other forms.

The above-mentioned units illustrated as separated parts may be or may not be separated physically, and the parts displayed as units may be or may not be physical units. That is, the parts may be located at one place or distributed in multiple network units. Some or all of the units may be selected according to actual needs to achieve the objectives of the solutions of the embodiments.

In addition, the functional units in various embodiments of the present disclosure may be integrated in one processing unit, or each unit may exist alone physically, or two or more units may be integrated in one unit. The integrated unit above may be implemented in the form of hardware, or in the form of software functional units.

The integrated unit may also be stored in a computer-readable storage medium if being implemented in the form of a software functional unit, and sold or used as an independent product. Based on such understanding, the essence of the technical solutions of the present disclosure, or the part contributing to the prior art, or all or part of the technical solutions, may be embodied in the form of a software product which is stored in a storage medium including a number of instructions such that a computer device (which may be a personal computer, a server, or a network device, etc.) performs all or part of the method described in each of the embodiments of the present disclosure. The foregoing storage medium includes: any medium that is capable of storing program codes such as a USB disk, a mobile hard disk, a Read-Only Memory (referred to as ROM), a Random Access Memory (referred to as RAM), a magnetic disk or an optical disk, and the like.

For the step numbers in the above method embodiments, they are only set for convenience of explanation, the order between the steps is not limited, and the execution order of each step in the embodiments may be adaptively adjusted according to the understanding of those having ordinary skills in the art.

The foregoing describes the preferred embodiments of the present disclosure in detail, but the present disclosure is not limited to the embodiments, those having ordinary skills in the art can make various equal deformations or replacements without departing from the gist of the present disclosure, and these equal deformations or replacements shall all fall within the scope defined by the claims of the present disclosure.

What is claimed is:

1. A GIS partial discharge diagnosing method applied to a GIS partial discharge diagnosing device, wherein the GIS partial discharge diagnosing device comprises a monitoring host, a network relay device and a plurality of sensor modules distributed on a GIS, the monitoring host is computer equipment or server equipment, and the sensor modules are used for monitoring ultra high frequency signals generated when GIS partial discharge occurs, and the ultra high frequency signals are electromagnetic wave signals in a range of 300-3000 MHz; each of the sensor modules comprises a wireless transmission device and is in communication with the network relay device, and the sensor modules are connected with each other through an ad-hoc network of the wireless transmission devices to form a wireless transmission network, each of the sensor modules obtains a distance from other sensor modules through a wireless communication time, so as to obtain sensor network position distribution data of each of the sensor modules in the wireless transmission network, and the network position distribution data are sent to the network relay device, and the monitoring host is in communication with the network relay device;

the diagnosing method comprises:

obtaining, by the monitoring host, monitoring data of each sensor module, the monitoring data comprising partial discharge ultra high frequency signals monitored by each sensor module, receiving time information of the partial discharge ultra high frequency signals monitored by each sensor module and sensor network position distribution data of the wireless transmission network;

inputting, by the monitoring host, the monitoring data into a partial discharge diagnosing model for prediction processing, and determining a predicted partial discharge type;

wherein, the partial discharge diagnosing model is obtained by the following training method:

obtaining, by the monitoring host, the partial discharge diagnosing model from a training server;

obtaining, by the monitoring host, training data, the training data comprising training feature data and labeling information; the training feature data comprising the partial discharge ultra high frequency signals monitored by each sensor module, the receiving time information of the partial discharge ultra high frequency signals monitored by each sensor module and the sensor network position distribution data of the wireless transmission network; the labeling information comprising a partial discharge type;

inputting, by the monitoring host and after vectorizing the training feature data, the vectorized training feature data into the partial discharge diagnosing model for prediction processing, and determining a predicted partial discharge type; and correcting, by the monitoring host, the partial discharge diagnosing model according to the predicted partial discharge type.

2. The GIS partial discharge diagnosing method according to claim 1, wherein the training data further comprises a signal attenuation feature, the signal attenuation feature comprises signal amplitude differences between the ultra high frequency signals detected by each sensor module or differences between various measurement items in a discharge spectrum of each sensor module.

3. The GIS partial discharge diagnosing method according to claim 1, wherein the obtaining, by the monitoring host, training data, comprises at least one of:

obtaining the training data from the training server, wherein the training data is data previously collected in other GIS partial discharge detecting devices;

or, obtaining the training data from a memory of the monitoring host, wherein the training data is data previously collected by the current GIS partial discharge diagnosing device;

or, collecting the partial discharge ultra high frequency signals which are detected by each sensor module and generated by a partial discharge generating device arranged on the GIS, and recording a time when each sensor module receives the partial discharge ultra high frequency signals, the sensor network position distribution data perceived by each sensor module when communicating with each other, and the partial discharge type determined when the partial discharge generating device is arranged, to obtain the training data;

or, obtaining the training data through a partial discharge simulating model established by a computer, wherein the training data is simulated test data.

4. The GIS partial discharge diagnosing method according to claim 1, wherein the inputting, by the monitoring host and after vectorizing the training feature data, the vectorized training feature data into the partial discharge diagnosing model for prediction processing, and determining a predicted partial discharge type inputting the training feature data into the partial discharge diagnosing model for prediction processing, and determining a predicted partial discharge type, comprises:

vectorizing the partial discharge ultra high frequency signals to obtain a partial discharge ultra high frequency signal feature;

vectorizing the receiving time information and the sensor network position distribution data respectively to obtain a receiving time feature and a sensor network position distribution feature;

inputting the receiving time feature and the sensor network position distribution feature into a fusion model for cross combination to obtain an interactive feature, and combining, by the fusion model, the receiving time feature, the sensor network position distribution feature and the interactive feature to obtain a combined attribute feature;

concatenating the combined attribute feature with the partial discharge ultra high frequency signal feature to obtain a partial discharge ultra high frequency signal fused feature; and inputting the partial discharge ultra high frequency signal fused feature into a partial discharge diagnosing model for prediction processing, and determining the predicted partial discharge type; and the correcting the partial discharge diagnosing model according to the predicted partial discharge type, comprises:

correcting the partial discharge diagnosing model and the fusion model according to the predicted partial discharge type.

5. The GIS partial discharge diagnosing method according to claim 4, wherein the combining, by the fusion model, the receiving time feature, the sensor network position distribution feature and the interactive feature to obtain a combined attribute feature, comprises:

weighting and summing the receiving time feature, the sensor network position distribution feature and the interactive feature to obtain the combined attribute feature.

6. The GIS partial discharge diagnosing method according to claim 5, wherein the combined attribute feature is expressed as:

$$S_P=W_0+W_1d_1+W_2d_2+W_3d_1d_2;$$

wherein $S_P$ is the combined attribute feature, $W_0$, $W_1$, $W_2$ and $W_3$ are parameters of the fusion model, $d_1$ is a value of the receiving time feature, and $d_2$ is a value of the sensor network position distribution feature.

7. The GIS partial discharge diagnosing method according to claim 1, wherein the sensor modules are arranged outside the GIS, and the GIS comprises a plurality of preset sensors arranged inside a GIS pipeline, the plurality of preset sensors are used for detecting the ultra high frequency signals generated when the GIS partial discharge occurs and outputting the ultra high frequency signals to the monitoring host, and the monitoring host forms a second discharge spectrum according to the ultra high frequency signals detected by each preset sensor; and the training feature data further comprises the second discharge spectrum.

8. The GIS partial discharge diagnosing method according to claim 1, wherein the partial discharge type in the labeling information is obtained by:

when the GIS partial discharge occurs, obtaining, by the monitoring host or the training server, the partial discharge ultra high frequency signals monitored by each sensor module, and generating a monitored discharge spectrum according to the partial discharge ultra high frequency signals, and determining, by the monitoring host, a partial discharge occurrence type according to the monitored discharge spectrum and a classical discharge spectrum, and further determining the partial discharge type in the labeling information; and the training method further comprises:

comparing the predicted partial discharge type with the partial discharge type in the labeling information to determine a prediction accuracy rate of the partial discharge diagnosing model in a current training step; and when the prediction accuracy rate is greater than a preset value, generating a target discharge spectrum based on the partial discharge ultra high frequency signals in the training feature data, and updating the classical discharge spectrum according to the target discharge spectrum.

9. A training method for a GIS partial discharge diagnosing model applied to a GIS partial discharge diagnosing device, wherein the GIS partial discharge diagnosing device comprises a monitoring host, a network relay device and a plurality of sensor modules distributed on a GIS, the monitoring host is computer equipment or server equipment, and the sensor modules are used for monitoring ultra high frequency signals generated when GIS partial discharge occurs, and the ultra high frequency signals are electromagnetic wave signals in a range of 300-3000 MHz; each of the sensor modules comprises a wireless transmission device and is in communication with the network relay device, and the sensor modules are connected with each other through an ad-hoc network of the wireless transmission devices to form a wireless transmission network, each of the sensor modules obtains a distance from other sensor modules through a wireless communication time, so as to obtain sensor network position distribution data of each of the sensor modules in the wireless transmission network, and the network position distribution data are sent to the network relay device, and the monitoring host is in communication with the network relay device; and the training method comprises:

obtaining, by the monitoring host, the partial discharge diagnosing model from a training server;

obtaining, by the monitoring host, training data, the training data comprising training feature data and labeling information; the training feature data comprising partial discharge ultra high frequency signals monitored by each sensor module, receiving time information of the partial discharge ultra high frequency signals monitored by each sensor module and sensor network position distribution data of the wireless transmission network; and the labeling information comprising a partial discharge type;

inputting, by the monitoring host and after vectorizing the training feature data, the vectorized training feature data into the partial discharge diagnosing model for prediction processing, and determining a predicted partial discharge type; and correcting, by the monitoring host, the partial discharge diagnosing model according to the predicted partial discharge type.

10. A global training method for a GIS partial discharge diagnosing model applied to a global training system, wherein the global training system comprises a training server and a plurality of GIS partial discharge diagnosing devices on different transformer substation GISs, each of the GIS partial discharge diagnosing devices comprises a monitoring host, a network relay device and a plurality of sensor modules distributed on a GIS, the monitoring host is computer equipment or server equipment, and the sensor modules are used for monitoring ultra high frequency signals generated when the GIS partial discharge occurs, and the ultra high frequency signals are electromagnetic wave signals in a range of 300-3000 MHz; each of the sensor modules comprises a wireless transmission device and is in communication with the network relay device, and the sensor modules are connected with each other through an ad-hoc network of the wireless transmission devices to form a wireless transmission network, each of the sensor modules obtains a distance from other sensor modules through a wireless communication time, so as to obtain sensor network position distribution data of each of the sensor modules in the wireless transmission network, and the network position distribution data are sent to the network relay device, and the monitoring host is in communication with the network relay device;

a global GIS partial discharge diagnosing model is arranged in the training server; and the training method comprises:

obtaining, by each monitoring host, the global GIS partial discharge diagnosing model from the training server, and generating a corresponding partial discharge diagnosing model according to the global GIS partial discharge diagnosing model;

training, by each monitoring host, according to the training method for a GIS partial discharge diagnosing model according to claim 9, and obtaining network parameters of the trained partial discharge diagnosing model; and feeding back, by each monitoring host, the obtained network parameters to the training server, to enable the training server to update the global GIS partial discharge diagnosing model.

* * * * *